(12) United States Patent
Tsukahara et al.

(10) Patent No.: US 8,049,407 B2
(45) Date of Patent: Nov. 1, 2011

(54) ORGANIC ELECTROLUMINESCENT ELEMENT INCLUDING BLUE PHOSPHORESCENT LUMINESCENT MATERIAL

(75) Inventors: Jiro Tsukahara, Kanagawa (JP);
Tatsuya Igarashi, Kanagawa (JP);
Toshihiro Ise, Kanagawa (JP);
Yoshitaka Kitamura, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 1280 days.

(21) Appl. No.: 11/225,207

(22) Filed: Sep. 14, 2005

(65) Prior Publication Data

US 2006/0057427 A1    Mar. 16, 2006

(30) Foreign Application Priority Data

Sep. 15, 2004 (JP) ................................. 2004-268559
Mar. 4, 2005 (JP) ................................. 2005-060877

(51) Int. Cl.
*H05B 33/14* (2006.01)
*H05B 33/12* (2006.01)
*C09K 11/06* (2006.01)

(52) U.S. Cl. ......... 313/504; 313/506; 428/690; 428/917
(58) Field of Classification Search .......... 313/501–512; 445/24–25; 427/76–77
See application file for complete search history.

(56) References Cited

U.S. PATENT DOCUMENTS

| | | | |
|---|---|---|---|
| 6,900,588 B2 * | 5/2005 | Adachi et al. | 313/504 |
| 2002/0071963 A1 * | 6/2002 | Fujii | 428/690 |
| 2003/0198831 A1 * | 10/2003 | Oshiyama et al. | 428/690 |
| 2005/0048314 A1 * | 3/2005 | Antoniadis et al. | 428/690 |
| 2005/0064235 A1 * | 3/2005 | Liao et al. | 428/690 |
| 2005/0173700 A1 * | 8/2005 | Liao et al. | 257/40 |
| 2006/0019116 A1 * | 1/2006 | Conley et al. | 428/690 |

FOREIGN PATENT DOCUMENTS

| | | |
|---|---|---|
| JP | 7-106066 A | 4/1995 |
| JP | 11-204259 A | 7/1999 |
| JP | 2002-100476 A | 4/2002 |
| JP | 2003-7467 A | 1/2003 |
| JP | 2004-6287 A | 1/2004 |
| JP | 2004-139819 A | 5/2004 |
| JP | 2004-522264 A | 7/2004 |
| JP | 2004-234952 A | 8/2004 |
| JP | 2004221063 A * | 8/2004 |

OTHER PUBLICATIONS

Igarashi et al., JP 2004-221063, Aug. 2004, machine translation.*
Japanese Office Action (Notice of Reasons for Rejection) dated Jul. 6, 2010 for Application No. 2005-267288.
JPO Notice of Reasons for Rejection, Appl. No. 2005-267288, May 31, 2011, pp. 1-3 (w/ English translation).

* cited by examiner

*Primary Examiner* — Anne Hines
*Assistant Examiner* — Tracie Green
(74) *Attorney, Agent, or Firm* — Birch, Stewart, Kolasch & Birch, LLP

(57) ABSTRACT

The present invention provides an organic electroluminescent element that includes a pair of electrodes and a plurality of organic compound layers being disposed between the pair of electrodes. The organic compound layers include a luminescent layer containing a blue phosphorescent luminescent material and a host material having the lowest excited triplet energy ($T_1$) of 272 kJ/mol (65 kcal/mol) or more, and hole transport layers. One of the hole transport layers is a layer adjacent to the luminescent layer, and when the ionization potentials of the luminescent layer, the hole transport layer adjacent to the luminescent layer, and another of the hole transport layers, respectively, designated to Ip1, Ip2 and Ip3, the relationship Ip1>Ip2>Ip3 is satisfied.

16 Claims, 1 Drawing Sheet

ORGANIC ELECTROLUMINESCENT ELEMENT INCLUDING BLUE PHOSPHORESCENT LUMINESCENT MATERIAL

CROSS-REFERENCE TO RELATED APPLICATION

This application claims priority under 35 USC 119 from Japanese Patent Applications Nos. 2004-268559 and 2005-060877, the disclosures of which are incorporated by reference herein.

BACKGROUND OF THE INVENTION

1. Field of the Invention

The present invention relates to an organic electroluminescent element that converts electric energy to light and luminesce.

2. Description of the Related Art

An organic electroluminescent element is made of an organic compound layer that includes at least a luminescent layer and a pair of electrodes that sandwich the organic compound layer. When an electric field is applied between both electrodes, electrons are injected from a cathode and holes are injected from an anode. The electrons and holes recombine in a luminescent layer to luminesce.

One important problem in an organic electroluminescent element is a problem of development of a blue phosphorescent organic electroluminescent element (hereinafter, referred to as "blue phosphorescent luminescent element" for convenience). When a blue phosphorescent luminescent element is designed, it is important to achieve firstly high luminous efficiency and secondly high driving durability.

As a blue phosphorescent luminescent element that takes the problem into consideration, for instance, Japanese Patent Application Laid-Open (JP-A) No. 2004-6287 discloses a blue phosphorescent luminescent element in which differences of energy levels of LUMO and energy levels of HOMO in between a hole block layer and a luminescent layer and relationship between a band gap and a molecular weight of a host compound are taken into consideration. However, the blue phosphorescent luminescent element disclosed in the literature is not sufficiently high in the luminous efficiency and the driving durability.

Furthermore, in a luminescent layer of a blue phosphorescent luminescent element, a blue phosphorescent luminescent material and a host material are included. The blue phosphorescent luminescent material normally has the lowest excited triplet energy ($T_1$) (hereinafter, referred to as "$T_1$ energy" for convenience) of 272 kJ/mol (65 kcal/mol) or more. Accordingly, in order to achieve high luminous efficiency, a host material having a $T_1$ energy of 272 kJ/mol (65 kcal/mol) or more is necessary. However, the host material having a $T_1$ energy of 272 kJ/mol (65 kcal/mol) or more is difficult to inject with electric charges (holes or electrons), as a result, there is a problem in that the driving durability is poor.

Thus, at present, a blue phosphorescent luminescent element that combines high luminous efficiency and high driving durability is not yet provided.

BRIEF DESCRIPTION OF THE DRAWINGS

In FIG. 1, element identifiers 1, 2, 3, 4 and 5 are as follows:

Figure 1:
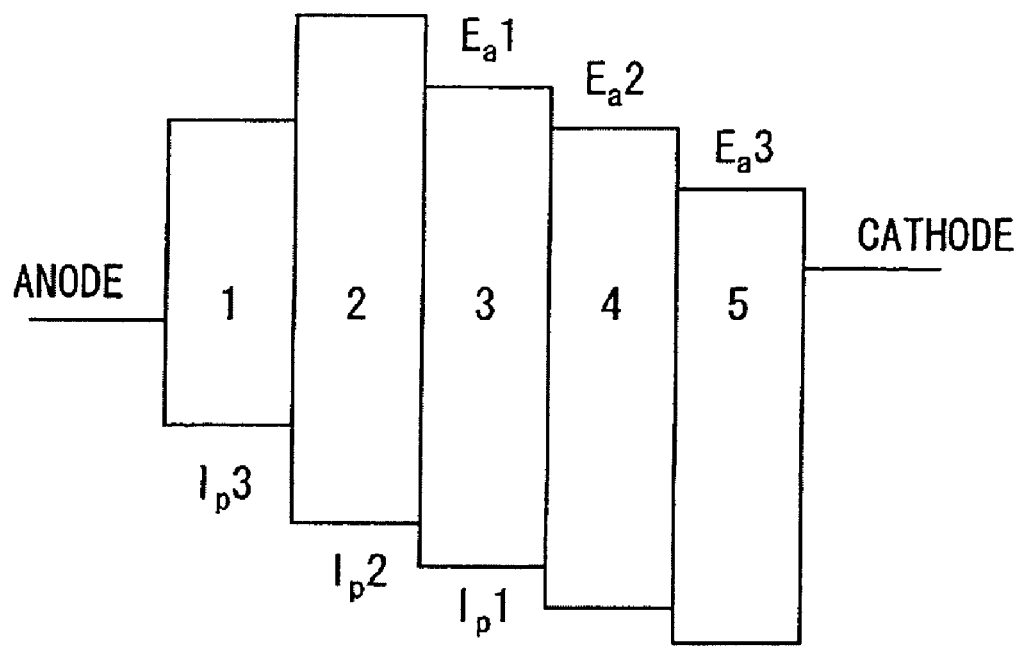
FIG. 1 is a cross sectional view of an organic electroluminescent element of the present invention.

1. another of the hole transport layer.
2. a hole transport layer adjacent to the luminescent layer.
3. a luminescent layer.
4. an electron transport layer adjacent to the luminescent layer.
5. another of the electron transport layer.

SUMMARY OF THE INVENTION

The present invention was achieved in view of the above-mentioned situations and provides a blue phosphorescent luminescent organic electroluminescent element that combines high luminous efficiency and high driving durability.

The inventors found that with a blue phosphorescent luminescent material and a host material having a $T_1$ energy of 272 kJ/mol (65 kcal/mol) or more, by disposing a luminescent layer and a plurality of electric charge transport layers, and by controlling so that the ionization potential and/or the electron affinity in between the luminescent layer and the plurality of charge transport layers satisfy a predetermined relationship, high luminous efficiency and high driving durability can be combined, and thereby the invention came to completion.

A first aspect of the invention is to provide an organic electroluminescent element comprising: a pair of electrodes, and a plurality of organic compound layers being disposed between the pair of electrodes and which include a luminescent layer containing a blue phosphorescent luminescent material and a host material having the lowest excited triplet energy ($T_1$) of 272 kJ/mol (65 kcal/mol) or more, and hole transport layers, wherein one of the hole transport layers is a layer adjacent to the luminescent layer, and when the ionization potentials of the luminescent layer, the hole transport layer adjacent to the luminescent layer, and another of the hole transport layers, respectively, are designated to Ip1, Ip2 and Ip3, the relationship Ip1>Ip2>Ip3 is satisfied.

A second aspect of the invention is to provide an organic electroluminescent element comprising: a pair of electrodes, and a plurality of organic compound layers being disposed between the electrodes and which include a luminescent layer containing a blue phosphorescent luminescent material and a host material having the lowest excited triplet energy ($T_1$) of 272 kJ/mol (65 kcal/mol) or more, and electron transport layers, wherein one of the electron transport layer is a layer adjacent to the luminescent layer, and when the electron affinities of the luminescent layer, the electron transport layer adjacent to the luminescent layer, and another of the electron transport layers, respectively, are designated to Ea1, Ea2 and Ea3, the relationship Ea1<Ea2<Ea3 is satisfied, and the lowest excited triplet energy ($T_1$) of the electron transport layer adjacent to the luminescent layer is 272 kJ/mol (65 kcal/mol) or more.

A third aspect of the invention is to provide an organic electroluminescent element comprising: a pair of electrodes, and a plurality of organic compound layers being disposed between the pair of electrodes and which include a luminescent layer containing a blue phosphorescent luminescent material and a host material having the lowest excited triplet energy ($T_1$) of 272 kJ/mol (65 kcal/mol) or more, hole transport layers, and electron transport layers, wherein one of the hole transport layers and one of the electron transport layers are layers adjacent to the luminescent layer, and when the ionization potentials of the luminescent layer, the hole transport layer adjacent to the luminescent layer, and another of the hole transport layers, respectively, designated to Ip1, Ip2 and Ip3, and the electron affinities of the luminescent layer, the electron transport layer adjacent to the luminescent layer, and another of the electron transport layers, respectively, designated to Ea1, Ea2 and Ea3, the relationships Ip1>Ip2>Ip3 and Ea1<Ea2<Ea3 are satisfied, and the lowest excited triplet energy ($T_1$) of the electron transport layer adjacent to the luminescent layer is 272 kJ/mol (65 kcal/mol) or more.

A fourth aspect of the invention is to provide an organic electroluminescent element comprising: a pair of electrodes, and a plurality of organic compound layers being disposed between the pair of electrodes and which include first and second luminescent layers each containing a blue phosphorescent luminescent material and a host material having the lowest excited triplet energy ($T_1$) of 272 kJ/mol (65 kcal/mol) or more, hole transport layers, and electron transport layers, wherein one of the hole transport layers is a layer adjacent to the first luminescent layer, one of the electron transport is a layer adjacent to the second luminescent layer, the first and second luminescent layers each contain a host material different from each other, and when the ionization potentials of the first luminescent layer, the hole transport layer adjacent to the luminescent layer, and another of the hole transport layers, respectively, are designated to Ip1, Ip2 and Ip3, and when the electron affinities of the second luminescent layer, the electron transport layer adjacent to the luminescent layer, and another of the electron transport layers, respectively, are designated to Ea1, Ea2 and Ea3, the relationships Ip1>Ip2>Ip3 and Ea1 <Ea2<Ea3 are satisfied.

DETAILED DESCRIPTION OF THE INVENTION

Hereinbelow, details of an organic electroluminescent element (hereinafter, also referred to as "organic EL element" or "luminescent element") according to the present invention will be explained. In the specification, a numerical range that contains numerical values described before and after "to" means there values are the lower and upper limits.

A first aspect of the invention relates to an organic electroluminescent element that includes, a pair of electrodes, and a plurality of organic compound layers being disposed between the pair of electrodes and which include a luminescent layer containing a blue phosphorescent luminescent material and a host material having the lowest excited triplet energy ($T_1$) of 272 kJ/mol (65 kcal/mol) or more, and hole transport layers, wherein one of the hole transport layers is a layer adjacent to the luminescent layer, and when the ionization potentials of the luminescent layer, the hole transport layer adjacent to the luminescent layer, and another of the hole transport layers, respectively, are designated to Ip1, Ip2 and Ip3, the relationship Ip1>Ip2>Ip3 is satisfied.

Owing to the above-mentioned configuration, high luminous efficiency and high driving durability can be combined.

In the first aspect, from a viewpoint of improving the luminous efficiency, the $T_1$ energy of the hole transport layer adjacent to the luminescent layer is preferably 272 kJ/mol (65 kcal/mol) or more.

An exact mechanism caused by the configuration is not necessarily clear. However, it is assumed that, owing to there being the host material that has a $T_1$ energy of 272 kJ/mol (65 kcal/mol) or more contained in the luminescent layer, high luminous efficiency is exhibited, and by disposing a plurality of hole transport layers including a layer adjacent to the luminescent layer and by controlling the relationship of the ionization potentials between the luminescent layer and the plurality of hole transport layers, injection of electric charges (holes) is promoted leading to exhibition of high driving durability. Furthermore, in this aspect, as the layer adjacent to the luminescent layer, the layer having the largest ionization potential of the plurality of hole transport layers is disposed. When such a configuration is adopted, an electric charge injection barrier is lowered and thereby electric charges are inhibited from staying at the hole transport layer/luminescent layer interface. It is assumed that, as the result materials are inhibited from deteriorating and thereby the driving durability is improved.

A second aspect relates to an organic electroluminescent element comprising: a pair of electrodes, and a plurality of organic compound layers being disposed between the electrodes and which include a luminescent layer containing a blue phosphorescent luminescent material and a host material having the lowest excited triplet energy ($T_1$) of 272 kJ/mol (65 kcal/mol) or more, and electron transport layers, wherein one of the electron transport layer is a layer adjacent to the luminescent layer, and when the electron affinities of the luminescent layer, the electron transport layer adjacent to the luminescent layer, and another of the electron transport layers, respectively, are designated to Ea1, Ea2 and Ea3, the relationship Ea1<Ea2<Ea3 is satisfied, and the lowest excited triplet energy ($T_1$) of the electron transport layer adjacent to the luminescent layer is 272 kJ/mol (65 kcal/mol) or more.

By forming the above-mentioned configuration, high luminous efficiency and high driving durability can be combined.

The exact mechanism caused by the configuration is not necessarily clear. However, it is assumed that, owing to there being the host material that has a $T_1$ energy of 272 kJ/mol (65 kcal/mol) or more contained in the luminescent layer, high luminous efficiency is exhibited, and by disposing a plurality of electron transport layers including an electron transport layer that is adjacent to the luminescent layer and has the $T_1$ energy of 272 kJ/mol (65 kcal/mol) or more and by further controlling the relationship of the electron affinities between the luminescent layer and the plurality of electron transport layers, injection of electric charges (electrons) is promoted to leading exhibition of high driving durability. Furthermore, in this aspect, as the layer adjacent to the luminescent layer, an electron transport layer having a $T_1$ energy of 272 kJ/mol (65 kcal/mol) or more is disposed. When such a configuration is adopted, an electric charge injection barrier is lowered and thereby electric charges are inhibited from staying at a electron transport layer/luminescent layer interface. It is assumed that, as a result materials are inhibited from deteriorating and thereby the driving durability is improved.

Furthermore, when an organic electroluminescent element according to the invention relates to an aspect obtained by combining the first and second aspects, the driving durability can be further improved. A third aspect of the invention relates to an organic electroluminescent element according to such an aspect. That is, a third aspect of the invention relates to an organic electroluminescent element comprising: a pair of electrodes, and a plurality of organic compound layers being disposed between the pair of electrodes and which include a luminescent layer containing a blue phosphorescent luminescent material and a host material having the lowest excited triplet energy ($T_1$) of 272 kJ/mol (65 kcal/mol) or more, hole transport layers, and electron transport layers, wherein one of the hole transport layers and one of the electron transport layers are layers adjacent to the luminescent layer, and when the ionization potentials of the luminescent layer, the hole transport layer adjacent to the luminescent layer, and another of the hole transport layers, respectively, designated to Ip1, Ip2 and Ip3, and the electron affinities of the luminescent layer, the electron transport layer adjacent to the luminescent layer, and another of the electron transport layers, respectively, designated to Ea1, Ea2 and Ea3, the relationships Ip1>Ip2>Ip3 and Ea1<Ea2<Ea3 are satisfied, and the lowest excited triplet energy ($T_1$) of the electron transport layer adjacent to the luminescent layer is 272 kJ/mol (65 kcal/mol) or more.

When the pluralities of hole transport layers and electron transport layers are disposed adjacent to the luminescent layer and the relationships of the ionization potentials and electron affinities in the respective layers are controlled as in the third aspect, higher driving durability can be exhibited.

In the third aspect, from a viewpoint of improving the luminous efficiency, the $T_1$ energy of the hole transport layer adjacent to the luminescent layer is also preferably 272 kJ/mol (65 kcal/mol) or more.

Still furthermore, as an organic electroluminescent element according to the invention, from a viewpoint of further improving the driving durability, the luminescent layer may be formed of two layers different in the host material. A fourth aspect of the invention relates to an organic electroluminescent element comprising: a pair of electrodes, and a plurality of organic compound layers being disposed between the pair of electrodes and which include first and second luminescent layers each containing a blue phosphorescent luminescent material and a host material having the lowest excited triplet energy ($T_1$) of 272 kJ/mol (65 kcal/mol) or more, hole transport layers, and electron transport layers, wherein one of the hole transport layers is a layer adjacent to the first luminescent layer, one of the electron transport is a layer adjacent to the second luminescent layer, the first and second luminescent layers each contain a host material different from each other, and when the ionization potentials of the first luminescent layer, the hole transport layer adjacent to the luminescent layer, and another of the hole transport layers, respectively, are designated to Ip1, Ip2 and Ip3, and when the electron affinities of the second luminescent layer, the electron transport layer adjacent to the luminescent layer, and another of the electron transport layers, respectively, are designated to Ea1, Ea2 and Ea3, the relationships Ip1>Ip2>Ip3 and Ea1<Ea2<Ea3 are satisfied.

In the fourth aspect, both the lowest excited triplet energies ($T_1$) of the electron transport layer adjacent to the luminescent layer and the hole transport layer adjacent to the luminescent layer are preferably 272 kJ/mol (65 kcal/mol) or more.

Now, by "the ionization potential" of each of the layers in a luminescent element according to the invention means the ionization potential of the material which has the lowest ionization potential among materials that are contained by 10% by mass by mass or more in the layer. As the ionization potentials in the specification, values measured with an AC-1 (trade name, manufactured by RIKEN KEIKI Co., Ltd. ) under room temperature and atmospheric pressure are adopted. The measurement principle of the AC-1 is described in Chihaya Adachi et al., *Work Function Data Of Organic Thin Films*, CMC Publishing Co., Ltd (2004).

The "electron affinity" of each of the layers in a luminescent element according to the invention means the electron affinity of the material which has the largest electron affinity among materials that are contained by 10% by mass or more in the layer. The electron affinity in the invention was obtained by measuring the ultraviolet/visible absorption spectrum of a film used to measure the ionization potential was measured, the energy at the longer wavelength edge of the absorption spectrum was used to obtain the excitation energy. From the values of the excitation energy and the ionization potential the electron affinity was calculated. In the specification, the UV/visible absorption spectrum was measured with a Spectrophotometer UV3100 (trade name, manufactured by Shimadzu Corporation).

The lowest triplet excited energy ($T_1$ energy) in the invention was obtained, by measuring the phosphorescent spectrum of a film used in the measurement of the ionization potential, and obtained from the energy of the shortest wavelength edge of the phosphorescent spectrum. As the lowest triplet excited energy in the invention, values measured under a temperature condition of 77K with a F4500 (trade name, manufactured by Hitachi Ltd. ) are adopted.

In each of the luminescent elements according to the invention, it is necessary that the relationship between the ionization potentials of a luminescent layer, a hole transport layer adjacent to the luminescent layer and another hole transport layer, and/or the relationship between the electron affinities of a luminescent layer, an electron transport layer adjacent to the luminescent layer and another electron transport layer satisfy a predetermined relationship. That is, in the first aspect, the relationship Ip1>Ip2>Ip3 has to be satisfied; in the second aspect, the relationship Ea1<Ea2<Ea3 has to be satisfied; and in the third and fourth aspect, the relationships Ip1>Ip2>Ip3 and Ea1<Ea2<Ea3 have to be satisfied.

Like the first, second and third aspects, when the luminescent layer is made of one layer, the ionization potential (Ip1) of the luminescent layer is preferably 6.4 eV or less, more preferably 6.3 eV or less and particularly preferably 6.2 eV or less. The electron affinity (Ea1) of the luminescent layer is preferably 2.1 eV or more, more preferably 2.2 eV or more and particularly preferably 2.3 eV or more.

When the luminescent layer is made of two layers as in the forth aspect, the ionization potential (Ip1) of the luminescent layer toward the anode (a first luminescent layer) is preferably 6.4 eV or less, more preferably 6.3 eV or less and particularly preferably 6.2 eV or less. The electron affinity (Ea1) of the luminescent layer toward the cathode (a second luminescent layer) is preferably 2.1 eV or more, more preferably 2.2 eV or more and particularly preferably 2.3 eV or more.

The ionization potential (Ip2) of the hole transport layer adjacent to the luminescent layer is preferably 6.2 to 5.3 eV, more preferably 6.1 to 5.4 eV and particularly preferably 6.0 to 5.5 eV.

The ionization potential (Ip3) of another hole transport layer is preferably 5.8 eV or less, more preferably 5.7 eV or less and particularly preferably 5.6 eV or less.

The electron affinity (Ea2) of the electron transport layer adjacent to the luminescent layer is preferably 2.2 to 3.1 eV, more preferably 2.3 to 3.0 eV and particularly preferably 2.4 to 2.9 eV.

The electron affinity (Ea3) of another electron transport layer is preferably 2.6 eV or more, more preferably 2.7 eV or more and particularly preferably 2.8 eV or more.

The relationship of the ionization potentials or the electron affinities in the invention can be controlled by selecting materials for constituting the respective layers from materials that show the foregoing ionization potentials or electron affinities and by combining these.

As a preferable combination of materials for constituting the respective layers to satisfy the relationship (Ip1>Ip2>Ip3) of the ionization potentials in the invention can be cited, for instance: NPD as the other hole transport layer material; HTM-1 described below as a material of the hole transport layer adjacent to the luminescent layer; and Host-1 described below as a material of the luminescent layer (host material).

Furthermore, as a preferable combination of materials for constituting the respective layers to satisfy the relationship (Ea1<Ea2<Ea3) of the electron affinities can be cited, for instance: Alq as a material of the other electron transport layer; ETM-1 described below as a material of the electron transport layer adjacent to the luminescent layer; and Host-2 described below as the material of the luminescent layer (host material).

Materials that can be used in the respective layers in the invention will be detailed below.

Elements that constitute an organic electroluminescent element according to the invention will be further described.

Organic electroluminescent elements are roughly divided into two categories, a bottom emission types and top emission types. The invention can be preferably applied to both types. In what follows, with the bottom emission type as an example, details of the invention will be explained. The organic electroluminescent element according to the bottom emission type normally has configuration of, from a substrate side, anode/hole transport layer/luminescent layer/cathode, or a configuration of, from a substrate side, anode/hole transport layer/luminescent layer/electron transport layer/cathode. In the invention, it is necessary to be a configuration that has a luminescent layer and a plurality of hole transport layers including a layer adjacent to the luminescent layer and/or a configuration that has a luminescent layer and a plurality of electron transport layers including a layer adjacent to the luminescent layer. Furthermore, the individual layers may be divided into a plurality of secondary layers.

Still furthermore, from the nature of the luminescent element, at least one electrode of the anode and cathode is preferably transparent. Normally, the anode is transparent.

As a typical configuration of the bottom emission type luminescent element according to the invention, from a substrate side, (1) a configuration of a transparent anode/a plurality of hole transport layers/a luminescent layer/an electron transport layer/a cathode (first aspect), (2) a configuration of a transparent anode/a hole transport layer/a luminescent layer/a plurality of electron transport layers/a cathode (second aspect), or (3) a configuration of a transparent anode/a plurality of hole transport layers/a single luminescent layer or two luminescent layers/a plurality of electron transport layers/a cathode (third and fourth aspects) is taken.

<Substrate>

The substrate that is used in the invention preferably does not scatter or attenuate light emitted from an organic compound layer. Specific examples thereof include inorganic materials such as yttria-stabilized zirconia (YSZ) and glass; and organic materials such as polyesters such as polyethylene terephthalate, polybutylene phthalate and polyethylene naphthalate, polystyrene, polycarbonate, polyether sulfone, polyarylate, polyimide, polycycloolefins, a norbornene resin and poly (chlorotrifluoroethylene). In the case of the organic materials, preferable substrates are those having excellent heat resistance, dimensional stability, solvent resistance, electrical insulating properties and processability.

A shape, structure, or magnitude of the substrate are not limited to particular one, and can be appropriately selected in accordance with applications and objects of the luminescent element. In general, a shape is planar one. A structure may be a single layer structure or a laminated structure, or may be formed of a single member or two or more members.

The substrate may be transparent and colorless or transparent and colored. However, from a viewpoint that light emitted from the luminescent layer may not be scattered or attenuated, the substrate is preferably transparent and colorless.

The substrate can be provided with a moisture-proof layer (gas barrier layer) on a front surface or back surface (transparent electrode side) thereof. As a material of the moisture-proof layer (gas barrier layer), inorganic materials such as silicon nitride and silicon oxide can be preferably used. The moisture-proof layer (gas barrier layer) can be formed by use of, for instance, a high-frequency sputtering method or the like. On a thermoplastic substrate, as need arises, a hard-coat layer or under-coat layer may be disposed.

Anode

An anode may normally have a function as an anode that supplies holes to an organic compound layer. A shape, structure and magnitude thereof are not particularly limited, and can be appropriately selected from known electrodes in accordance with applications and objects of the luminescent element. As mentioned above, the anode is preferable to be disposed as a transparent anode.

As a material of the anode, for instance, metals, alloys, metal oxides, organic electrically conductive compounds or mixtures thereof can be preferably cited, and materials having a work function of 4.0 eV or more are preferable. Specific examples of the material include tin oxide doped with antimony or fluorine (ATO, FTO); semi-conductive metal oxides such as tin oxide, zinc oxide, indium oxide, indium/tin oxide (ITO) and zinc/indium oxide (IZO); metals such as gold, silver, chromium and nickel; mixtures or laminated matters of the metals and electrically conductive metal oxides; inorganic electrically conductive materials such as copper iodide and copper sulfide; organic electrically conductive materials such as polyaniline, polythiophene and polypyrrole; and laminated matters of these and ITO.

The anode can be formed on the substrate in accordance with a method appropriately selected, in consideration of the compatibility with materials, from a wet method such as a printing method or a coating method; a physical method such as a vacuum deposition method, a sputtering method or an ion plating method; and a chemical method such as a CVD and a plasma CVD. When as a material of a transparent anode, for instance, ITO is selected, the transparent anode can be formed in accordance with a DC or a high frequency sputtering method, a vacuum deposition method or an ion plating method. Furthermore, when as a material of the transparent anode an organic electrically conductive material is selected, the transparent anode can be formed in accordance with a wet filming method.

A position where an anode is formed in a luminescent element, without restricting to particular one, may be appropriately selected in accordance with applications and objects of the luminescent element. It is preferably formed on the substrate. In this case, the anode may be formed on an entirety of one surface of the substrate or may be formed partially thereon. The anode may be patterned by use of a chemical etching owing to photolithography or the like, a physical etching with laser, a vacuum deposition or sputtering method with a mask superposed, a lift-off method or printing method.

A thickness of the anode can be appropriately selected depending on a material, is normally in a range of 10 nm to 50 µm, and preferably in a range of 5 nm to 20 µm. A value of the electrical resistance of the anode is preferably $10^3$ Ω/sq. or less and more preferably $10^2$ Ω/sq. or less.

When the anode is disposed as a transparent anode and luminescence is extracted from an anode side, the light transmittance thereof is preferably 60% or more and more preferably 70% or more. The light transmittance can be measured by use of a spectrophotometer according to a known method. Furthermore, in this case, the anode may be transparent and colorless or transparent and colored. As to the anode, a detailed description can be found in T. Sawada (supervising-editor), *New Development in Transparent Electrode Film (Toumei Denkyokumaku No Shin-Tenkai)*, CMC Publishing Co., Ltd. (1999), and the description thereof can be applied to the invention. When a plastic material having low heat resistance is used, an anode using ITO or IZO can be preferably deposited at a temperature of 150° C. or less.

Cathode

Normally, a cathode may only have a function as a cathode that injects electrons to the organic compound layer, and, a shape, structure and magnitude thereof, without particularly restricting, can be appropriately selected from known electrodes in accordance with applications and objects of the luminescent element.

As a material of the cathode, for instance, metals, alloys, metal oxides, electrically conductive compounds and mixtures thereof can be cited, and ones having a work function of 4.5 eV or less are preferable. Specific examples thereof include alkali metals (for instance, Li, Na, K, Cs and the like), alkaline earth metals (for instance, Mg, Ca and the like), gold, silver, lead, aluminum, a sodium-potassium alloy, a lithium-aluminum alloy, a magnesium-silver alloy, indium and rare earth metals such as ytterbium. These can be used singularly; however, from a viewpoint of combining the stability and the electron injection property, at least two kinds can be preferably used together. Among these, from a viewpoint of the electron injection property, the alkali metal and alkaline earth metal are preferable, and from a viewpoint of being excellent in the storage stability a material mainly made of aluminum is preferable. The material mainly made of aluminum means simple aluminum, or an alloy or a mixture of aluminum and 0.01 to 10% by mass of an alkali metal or an alkaline earth metal (for instance, lithium-aluminum alloy, magnesium-aluminum alloy and the like). The materials of the cathode are detailed in JP-A Nos. 02-15595 and 05-121172.

A method of forming a cathode is not particularly limited and a known method can be used to form. The cathode can be formed on the substrate in accordance with a method appropriately selected, in consideration of the compatibility with materials, for instance, from a wet method such as a printing method or a coating method; a physical method such as a vacuum deposition method, a sputtering method or an ion plating method; and a chemical method such as a CVD or a plasma CVD. When as a material of a cathode, for instance, metals or the like is selected, at least one kind or two kinds thereof are simultaneously or sequentially deposited according to a sputtering method or the like.

The cathode may be patterned by use of a chemical etching owing to photolithography or the like, a physical etching with laser, a vacuum deposition or sputtering method with a mask superposed, a lift-off method, or a printing method.

A position where a cathode is formed in a luminescent laminated body obtained by laminating the electrodes and the organic compound layer is not particularly limited. The cathode may be formed on an entirety on the organic compound layer or partially thereon.

A dielectric layer of 0.1 to 5 nm in thickness comprising a fluoride, oxide or the like of an alkali metal or an alkaline earth metal may be inserted in between the cathode and the organic compound layer. This dielectric layer can be regarded as a type of electron injecting layer. The dielectric layer can be formed by, for example, vacuum deposition, sputtering, ion plating or the like.

A thickness of the cathode can be appropriately selected depending on materials and cannot be categorically stipulated. However, it is normally in a range of 10 nm to 5 μm, and preferably in a range of 50 nm to 1 μm.

The cathode may be transparent or opaque. The transparent cathode can be formed by depositing a cathode material with a thickness such thin as 1 to 10 nm, followed by further laminating a transparent electrically conductive material such as ITO or IZO.

Organic Compound Layer

Formation of Organic Compound Layer

A method of forming an organic compound layer according to the invention is not particularly limited. A resistance heating deposition method, an electrophotography method, an electron beam method, a sputtering method, a molecule laminating method, a coating method (spray coat method, dip coat method, impregnating method, roll coat method, gravure coat method, reverse coat method, roll brush method, air-knife coat method, curtain coat method, spin coat method, flow coat method, bar coat method, micro-gravure coat method, air doctor coat method, blade coat method, squeeze coat method, transfer roll coat method, kiss coat method, cast coat method, extrusion coat method, wire-bar coat method, and screen coat method), an ink-jet method, a printing method and a transfer method can be used. Among these, when considering the characteristics, easiness of manufacturing and the cost of the elements, the resistance heating deposition method, the coating method and the transfer method are preferable. When the luminescent element has a laminated structure made of at least two layers, the foregoing methods can be combined to manufacture.

When a coating method is used, an organic compound can be dissolved or dispersed together with a resin component. The resin component include polyvinyl chloride, polycarbonate, polystyrene, polymethyl methacrylate, polyester, polysulfone, polyphenylene oxide, polybutadiene, poly(N-vinylcarbazole), a hydrocarbon resin, a ketone resin, a phenoxy resin, polyamide, ethyl cellulose, vinyl acetate, an ABS resin, polyurethane, a melamine resin, an unsaturated polyester resin, an alkyd resin, an epoxy resin and a silicone resin.

Hole Transport Layer and Hole Injecting Layer

A material of a hole transport layer or a hole injecting layer may only have any one of a function of injecting holes from an anode, a function of transporting holes and a function of blocking electrons injected from the cathode. Specific examples thereof include electrically conductive polymer oligomers such as carbazole, imidazole, dibenzoazepine, tribenzoazepine, triazole, oxazole, oxadiazole, polyarylalkane, pyrazoline, pyrazolone, phenylenediamine, arylamine, amino-substituted calcone, styrylanthrathene, fluorenone, hydrazone, stilbene, silazane, aromatic tert-amine compounds, styrylamine, aromatic dimethylidine compounds, porphyrin-base compounds, polysilane-base compounds, poly (N-vinylcarbazole), aniline-base copolymers, thiophene oligomers and polythiophene; aromatic metal complexes; transition metal complexes; or derivatives of the foregoing compounds.

In the invention, as a material of a hole transport layer adjacent to the luminescent layer, among the above, carbazole, phenylenediamine, arylamine, aromatic tert-amine compounds, dibenzoazepine and tribenzoazepine are preferable, and carbazole, aromatic tert-amine compounds and tribenzoazepine are more preferable.

Furthermore, as a material of other hole transport layer, among the above, carbazole, phenylenediamine, arylamine, aromatic tert-amine compounds, dibenzoazepine and tribenzoazepine are preferable, and carbazole, aromatic tert-amine compounds and tribenzoazepine are more preferable.

In the first, third and fourth aspects of the invention, when the ionization potentials of the luminescent layer, the hole transport layer adjacent to the luminescent layer, and another of hole transport layers, respectively, are designated to Ip1, Ip2 and Ip3, the relationship Ip1>Ip2>Ip3 is necessary to be satisfied. When materials constituting plurally existing hole transport layers are selected, the relationship with a material contained in the luminescent layer described below has to be considered.

The plurally existing hole transport layers are constituted so that the ionization potential of a layer positioned toward the luminescent layer may be larger than that of a layer positioned toward the anode. For instance, when in addition to the hole transport layer adjacent to the luminescent layer two other hole transport layers are disposed, the two other hole transport layers are disposed so that the relationship between the ionization potential (Ip3-1) of the other hole transport layer located toward the luminescent layer and the ionization potential (Ip3-2) of the other hole transport layer located toward the anode may satisfy Ip3-1>Ip3-2.

As mentioned above, in the respective aspects of the invention, the $T_1$ energy of the hole transport layer adjacent to the luminescent layer is preferably 272 kJ/mol (65 kcal/mol) or more, more preferably 276 kJ/mol (66 kcal/mol) or more, and further more preferably 280 kJ/mol (67 kcal/mol) or more.

Thicknesses of the hole injecting layer and hole transport layer are not particularly limited, and are normally preferably in a range of 1 nm to 5 μm, more preferably in a range of 5 nm to 1 μm, and further more preferably in a range of 10 nm to 500 nm. The hole transport layer may have a single layer structure made of at least one kind of the above-mentioned materials or a multi-layer structure having a plurality of layers made of the same composition or different kinds of compositions.

Electron Transport Layer and Electron Injecting Layer

A material of the electron transport layer or the electron injecting layer may only have any one of a function of injecting electrons from the cathode, a function of transporting electrons and a function of blocking holes injected from the anode. Specific examples thereof include aromatic ring tetracarboxylic acid anhydrides such as pyridine, pyrimidine, triazole, triazine, oxazole, phenanthroline, oxadiazole, imidazole, fluorenone, anthraquinodimethane, anthrone, diphenylquinone, thiopyran dioxide, carbodiimide, fluorenylidenemethane, distyrylpyrazine, silole, imidazopyridine and naphthalene perylene; various kinds of metal complexes typical in metal complexes of phthalocyanine and 8-quinolynol derivative or metal complexes having metal phthalocyanine, benzoxazole or benzothiazole as a ligand; or derivatives of the above compounds.

In the invention, as a material of the electron transport layer adjacent to the luminescent layer, among the above, pyridine, pyrimidine, triazine, phenanthroline, oxadiazole, imidazole, silole and imidazopyridine are preferable, and triazine, oxadiazole, imidazole and imidazopyridine are more preferable.

Among the above, pyridine, pyrimidine, triazine, phenanthroline, oxadiazole, imidazole, silole and imidazopyridine are preferable, and triazine, phenanthroline, oxadiazole, imidazole, silole and imidazopyridine are more preferable as a material of other electron transport layer,.

In the second, third and fourth aspects of the invention, when the electron affinities of the luminescent layer, the electron transport layer adjacent to the luminescent layer and another of electron transport layers, respectively, are designated to Ea1, Ea2 and Ea3, the relationship Ea1<Ea2<Ea3 is necessary to be satisfied. When materials that constitute a plurality of electron transport layers are selected, the relationship with a material included in the luminescent layer described below has to be taken into consideration.

The plurality of electron transport layers is constituted so that the electron affinity of a layer located toward the luminescent layer may be smaller than the electron affinity of a layer located toward the cathode.

Thicknesses of the electron injecting layer and electron transport layer are not particularly limited, and are normally preferably in the range of 1 nm to 5 μm, more preferably in the range of 5 nm to 1 μm, and further more preferably in the range of 10 nm to 500 nm. The electron injecting layer and electron transport layer may have a single layer structure made of at least one kind of the above-mentioned materials or a multi-layer structure having a plurality of layers made of the same composition or different kinds of compositions.

As mentioned above, in the second and third aspects of the invention, the $T_1$ energy of the electron transport layer most adjacent to the luminescent layer is necessary to be 272 kJ/mol (65 kcal/mol) or more and also in the other aspects it is preferably 272 kJ/mol (65 kcal/mol) or more. Furthermore, the $T_1$ energy of the electron transport layer adjacent to the luminescent layer is preferably 272 kJ/mol (65 kcal/mol) or more, more preferably 276 kJ/mol (66 kcal/mol) or more and further more preferably 280 kJ/mol (67 kcal/mol) or more.

Luminescent Layer

A luminescent layer in the invention is necessarily contains a blue phosphorescent luminescent material and a host material having the $T_1$ energy of 272 kJ/mol (65kcal/mol) or more (hereinafter, referred to as a "specific host material"), and, as far as the advantages of the invention are not impaired, other materials can be contained.

The host is a material that has, when a voltage is applied, a function of receiving holes from a hole transport layer or a hole injecting layer and receiving electrons from an electron injecting layer or an electron transport layer, a function of moving injected electric charges, a function of providing a field of recombination of holes and electrons to generate excitons, and a function of moving excitation energy.

The specific host material in the invention necessarily has the $T_1$ energy of 272 kJ/mol (65 kcal/mol) or more, preferably 276 kJ/mol (66 kcal/mol) or more, and more preferably 280 kJ/mol (67 kcal/mol) or more.

As examples of host materials that can be used in the invention, for instance, benzoxazole, benzoimidazole, benzothiazole, polyphenyl, coumarin, oxadiazole, pyralidine, pyrolopyridine, thiadiazolopyridine, aromatic dimethylidine compounds, carbazole, imidazole, triazole, oxazole, oxadiazole, polyarylcalcone, pyrazoline, pyrazolone, phenylenediamine, arylamine, amino-substituted calcone, fluorenone, hydrazone, silazane, aromatic tert-amine compounds, aromatic dimethylidine compounds, porphyrin-base compounds, polysilane-base compounds, poly(N-vinylcarbazole), various kinds of metal complexes typical in metal complexes with benzoxazole or benzothiazole as a ligand, or derivatives of the above compounds can be cited. The host materials may be used singularly or in a combination thereof.

Further, when a plurality of host materials is used in the luminescent layer, all of host materials that are used may be the specific host material, or the specific host material and other host material can be used together.

When the specific host material and other host materials are used together, a content of the specific host material in the luminescent layer is preferably in the range of 1:1 to 100:1 by mass ratio, and more preferably in the range of 4:1 to 20:1.

In the fourth aspect of the invention, it is necessary that the first luminescent layer and the second luminescent layer each have a specific host material different from each other.

Examples of the blue phosphorescent luminescent materials include complexes containing a transition metal atom or a lanthanoid atom. The transition metal atom is not particularly limited. Preferable transition metal atoms include ruthenium, rhodium, palladium, tungsten, rhenium, osmium, iridium and platinum, more preferably, rhenium, iridium and platinum.

The lanthanoid atoms include lanthanum, cerium, praseodymium, neodymium, samarium, europium, gadolinium, terbium, dysprosium, holmium, erbium, thulium, ytterbium and lutetium. Among the lanthanoid atoms, neodymium, europium and gadolinium are preferable.

As ligands of complexes, for instance, ligands described in, for instance, G. Wilkinson et al., *Comprehensive Coordination Chemistry*, Pergamon Press (1987), H. Yersin, *Photochemistry and Photophysics of Coordination Compounds*, Springer-Verlag (1987), and A. Yamamoto, *Metalorganic Chemistry-Fundamentals and Applications*-(*Yuukikinzoku Kagaku-Kiso to Ouyou-*), Shokabou (1982) can be cited. Specific examples of the ligands, preferably, include halogen ligands (preferably a chlorine ligand), nitrogen-containing heterocyclic ligands (for instance, phenylpyridine, benzoquinoline, quinolinol, bipyridyl and phenanthololine), diketone ligands (for instance, acetylacetone or the like), carboxylate ligands (for instance, an acetate ligand or the like), a carbon monoxide ligand, an isonitrile ligand and a cyano ligand. More preferably, the nitrogen-containing heterocyclic ligands can be exemplified. The complexes may have one transition metal atom in a compound or at least two transition metal atoms to form a so-called binuclear complex. Different kinds of metal atoms may be simultaneously contained. A metal complex particularly preferable as a blue phosphorescent luminescent material that is used in the invention is an iridium or platinum complex with phenylpyridines as a ligand. Blue phosphorescent luminescent materials may be used alone or combination of two or more.

When a luminescent layer made of a mixture of a blue phosphorescent luminescent material and a host material is formed, the host material and the blue phosphorescent luminescent material may be simultaneously vaporized and laminated on a substrate while controlling the speed of vaporization so as to control a ratio of the luminescent material; or a solution in which a host material and a luminescent material are dissolved at an appropriate concentration may be coated by means of a spin coat method, a spray method or an ink jet method to prepare.

A thickness of the luminescent layer, though not particularly limited, is normally in the range of 1 nm to 500 nm, preferably in the range of 5 nm to 200 nm, and more preferably in the range of 10 nm to 100 nm.

Furthermore, like the fourth aspect, also when two luminescent layers are disposed, a thickness of each of the luminescent layers, though not particularly limited, is preferably in the range of 1 nm to 250 nm, more preferably in the range of 2 nm to 100 nm and particularly preferably in the range of 5 nm to 50 nm.

Protective Layer

In the invention, an entirety of a luminescent element may be protected with a protective layer. As a material of the protective layer, ones having a function of inhibiting moisture, oxygen or the like that accelerate the deterioration of the element from entering the element can be used. Specific examples thereof include metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; metal nitrides such as SiNx and SiNxOy; metal fluorides such as $MgF_2$, LiF, $AlF_3$ and $CaF_2$; and polyethylene, polypropylene, polymethyl methacrylate, polyimide, polyurea, polytetrafluoroethylene, polychlorotrifluoroethylene, polydichlorodifluoroethylene, copolymers of chlorotrifluoeoethylene and dichlorodifluoroethylene, copolymers obtained by copolymerizing tetrafluoroethylene and a monomer mixture containing at least one kind of comonomer, fluorine-containing copolymers having a ring structure on a copolymer main chain, water-absorbing materials having the water absorption percentage of 1% or more, and moisture proof materials having the water absorption percentage of 0.1% or less.

A method of forming a protective layer is not limited to particular one. For instance, a vacuum deposition method, a sputtering method, a reactive sputtering method, an MBE (molecular beam epitaxy) method, a cluster ion beam method, an ion plating method, a plasma polymerization method (high-frequency excitation ion plating method), a plasma CVD method, a laser CVD method, a thermal CVD method, a gas source CVD method, a coating method, a printing method and a transfer method can be applied.

Sealing

In the invention, a whole element according to the invention may be sealed with a sealing container. In a space between the sealing container and the luminescent element, a moisture absorbent or inert liquid may be filled in. The moisture absorbent is not limited to particular one. For instance, barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite and magnesium oxide can be cited. The inert liquid is not limited to particular one. For instance, paraffins, liquid paraffins, fluorine base solvents such as perfluoroalkane, perfluoroamine or perfluoroether, chlorine base solvents and silicone oils can be cited.

Drive of Element

In a luminescent element according to the invention, when a DC (as need arises, an alternating component may be contained) voltage (normally in the range of 2 to 40 volt) or a DC current is applied between a transparent anode and a cathode, luminescence can be obtained. As to the drive of the luminescent element according to the invention, methods described in JP-A Nos. 02-148687, 06-301355, 05-29080, 07-134558, 08-234685 and 08-241047, U.S. Pat. Nos. 5,828,429 and 6,023,308, and Japanese Patent 2784615 can be used.

EXAMPLES

Hereinafter, organic electroluminescent elements of the invention will be specifically explained by way of Examples. However, the invention is not limited to the examples.

Example 1

1. Preparation of Organic Electroluminescent Element
(1) Preparation of an Example Organic Electroluminescent Element (TC-11)

A 2.5 cm square and 0.5 mm thick glass substrate with an ITO film (surface resistivity: 10 Ω/sq., manufactured by Geomatec Co., Ltd.) was put into a washing vessel, washed in 2-propanol by applying ultrasonic, followed by subjecting to a UV-ozone process for 30 min. On the transparent anode (ITO film), by use of a vacuum deposition method, organic compound layers below were sequentially deposited.

The deposition speed in the examples according to the invention, unless otherwise mentioned, was 0.2 nm/min. The deposition speed was measured with a quartz oscillator. Thicknesses of the layers described below were also measured with a quartz oscillator.

Values of the ionization potentials and electron affinities of the respective organic compound layers in the TC-11 are described together in configurations of the respective layers.

(First Hole Transport Layer)
Copper phthalocyanine: thickness of 10 nm
Ionization potential: 5.1 eV, electron affinity: 3.4 eV
(Second Hole Transport Layer)
NPD: thickness of 30 nm
Ionization potential: 5.4 eV, electron affinity: 2.4 eV
(Luminescent Layer)
Layer of a mixture of Host-1=95% by mass and BPM-1=5% by mass: thickness of 35 nm
Ionization potential: 6.0 eV, electron affinity: 2.4 eV
(First Electron Transport Layer)
BAlq: thickness of 5 nm
Ionization potential: 5.9 eV, electron affinity: 2.9 eV
(Second Electron Transport Layer)
Alq: thickness of 40 nm
Ionization potential: 5.8 eV, electron affinity: 3.0 eV Structures of NPD, Host-1, BPM-1, BAlq and Alq are shown below.

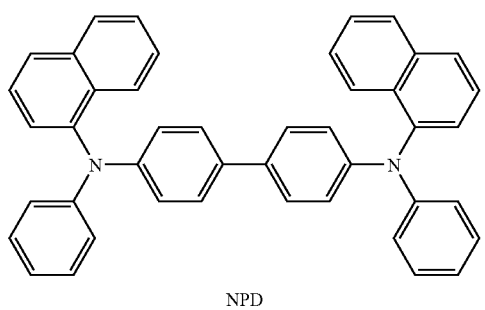

NPD

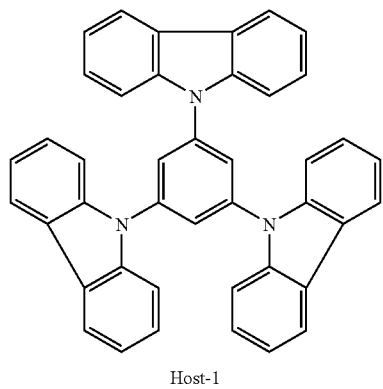

Host-1

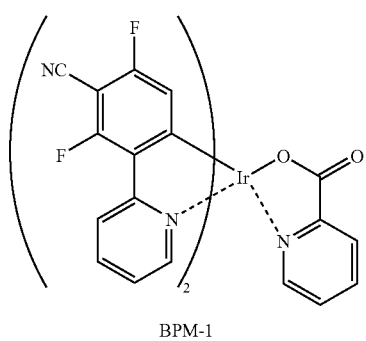

BPM-1

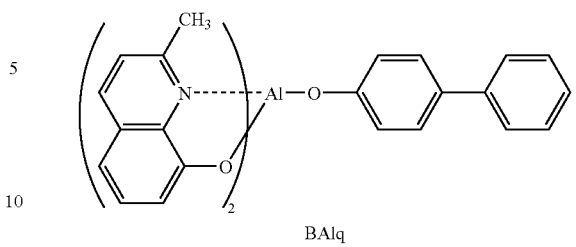

BAlq

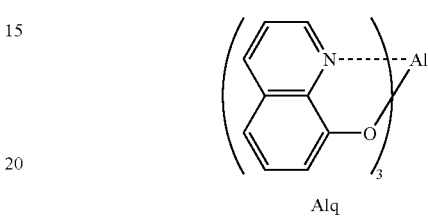

Alq

Finally, lithium fluoride and metal aluminum were deposited thereon in this order to a thickness of 0.1 nm and 100 nm, respectively, and thereby a cathode was formed.

This one, without bringing into contact with air, was brought into a glove box substituted by an argon gas, sealed with a stainless steel sealing canister and a UV-curable adhesive (trade name: XNR5516HV, manufactured by Nagase-Ciba Corp.), and thereby an organic electroluminescent element (TC-11) as an example was obtained.

(2) Preparation of an Example Organic Electroluminescent Element (TC-13)

An example organic electroluminescent element (TC-13) was prepared in a same manner of the organic electroluminescent element (TC-11), except that the configurations of organic compound layers were changed as shown below. Values of the ionization potentials and electron affinities of the respective organic compound layers in the TC-13 are described together in configurations of the respective layers.

(First Hole Transport Layer)
Copper phthalocyanine: thickness of 10 nm
Ionization potential: 5.1 eV, electron affinity: 3.4 eV
(Second Hole Transport Layer)
NPD: thickness of 30 nm
Ionization potential: 5.4 eV, electron affinity: 2.4 eV
(Luminescent Layer)
Layer of a mixture of Host-1=95% by mass and BPM-1=5% by mass: thickness of 35 nm
Ionization potential: 6.0 eV, electron affinity: 2.4 eV
(First Electron Transport Layer)
ETM-1: thickness of 5 nm
Ionization potential: 6.5 eV, electron affinity: 2.6 eV
(Second Electron Transport Layer)
Alq: thickness of 40 nm
Ionization potential: 5.8 eV, electron affinity: 3.0 eV Structures of NPD, Host-1, BPM-1 and Alq are as same as shown above. A structure of ETM-1 is shown below.

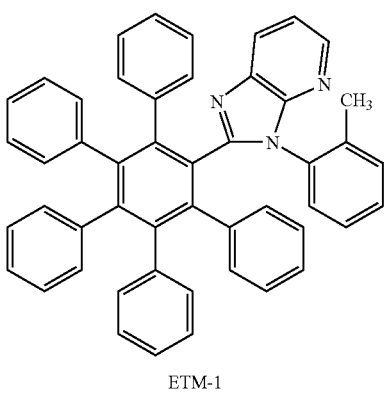

ETM-1

(3) Preparation of an Example Organic Electroluminescent Element (TC-14)

An example organic electroluminescent element (TC-14) was prepared in a same manner of the organic electroluminescent element (TC-11), except that the configurations of organic compound layers were changed as shown below. Values of the ionization potentials and electron affinities of the respective organic compound layers in the TC-14 are described together in configurations of the respective layers.
(First Hole Transport Layer)
Copper phthalocyanine: thickness of 10 nm
Ionization potential: 5.1 eV, electron affinity: 3.4 eV
(Second Hole Transport Layer)
NPD: thickness of 25 nm
Ionization potential: 5.4 eV, electron affinity: 2.4 eV
(Third Hole Transport Layer)
HTM-1: thickness of 5 nm
Ionization potential: 5.8 eV, electron affinity: 2.2 eV
(Luminescent Layer)
Layer of a mixture of Host-1=95% by mass and BPM-1=5% by mass: thickness of 35 nm
Ionization potential: 6.0 eV, electron affinity: 2.4 eV
(First Electron Transport Layer)
ETM-1: thickness of 5 nm
Ionization potential: 6.5 eV, electron affinity: 2.6 eV
(Second Electron Transport Layer)
Alq: thickness of 40 nm
Ionization potential: 5.8 eV, electron affinity: 3.0 eV Structures of NPD, Host-1, BPM-1, ETM-1 and Alq are as same as shown above. A structure of HTM-1 is shown below.

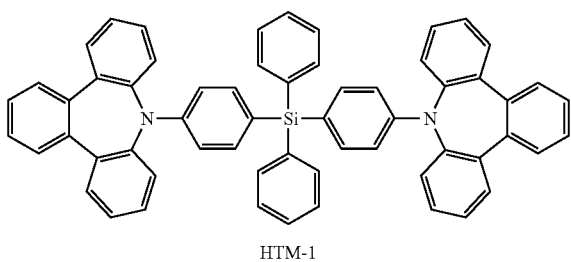

HTM-1

(4) Preparation of an Example Organic Electroluminescent Element (TC-15)

An organic electroluminescent element (TC-15) was prepared in a same manner of the organic electroluminescent element (TC-11), except that the configurations of an organic compound layer were changed as shown below. Values of the ionization potentials and electron affinities of the respective organic compound layers in the TC-15 are described together in configurations of the respective layers.
(First Hole Transport Layer)
Copper phthalocyanine: thickness of 100 nm
Ionization potential: 5.1 eV, electron affinity: 3.4 eV
(Second Hole Transport Layer)
NPD: thickness of 25 nm
Ionization potential: 5.4 eV, electron affinity: 2.4 eV
(Third Hole Transport Layer)
HTM-1: thickness of 5 nm
Ionization potential: 5.8 eV, electron affinity: 2.2 eV
(First Luminescent Layer)
Layer of a mixture of Host-1=95% by mass and BPM-1=5% by mass: thickness of 25 nm
Ionization potential: 6.0 eV, electron affinity: 2.4 eV
(Second Luminescent Layer)
Layer of a mixture of Host-2=95% by mass and BPM-1=5% by mass: thickness of 10 nm
Ionization potential: 6.6 eV, electron affinity: 2.5 eV
(First Electron Transport Layer)
ETM-1: thickness of 5 nm
Ionization potential: 6.5 eV, electron affinity: 2.6 eV
(Second Electron Transport Layer)
Alq: thickness of 40 nm
Ionization potential: 5.8 eV, electron affinity: 3.0 eV Structures of NPD, HTM-1, Host-1, BPM-1, ETM-1 and Alq are as same as shown above. A structure of Host-2 is shown below.

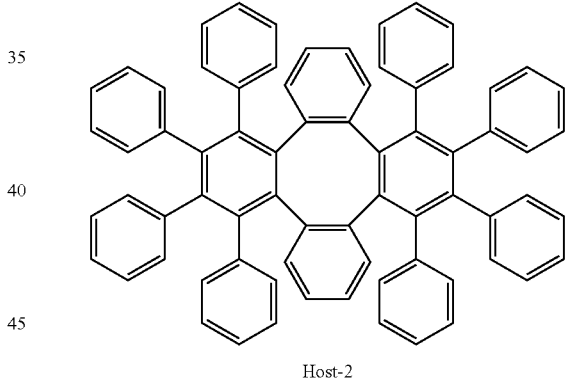

Host-2

(5) Preparation of an Example Organic Electroluminescent Element (TC-21)

A 2.5 cm square and 0.5 mm thick glass substrate with an ITO film (surface resistivity: 10 Ω/sq., manufactured by Geomatec Co., Ltd. ) was put into a washing vessel, washed in 2-propanol by applying ultrasonic, followed by subjecting to a UV-ozone process for 30 min. On the transparent anode (ITO film), by use of a vacuum deposition method, organic compound layers below were sequentially deposited.

Values of the ionization potentials and electron affinities of the respective organic compound layers in the TC-21 are described together in configurations of the respective layers.
(First Hole Transport Layer)
Copper phthalocyanine: thickness of 10 nm
Ionization potential: 5.1 eV, electron affinity: 3.4 eV
(Second Hole Transport Layer)
NPD: thickness of 30 nm
Ionization potential: 5.4 eV, electron affinity: 2.4 eV (Third Hole Transport Layer)
TCTA: thickness of 5 nm
Ionization potential: 5.7 eV, electron affinity: 2.3 eV
(Luminescent Layer)
Layer of a mixture of MCP=92% by mass and BPM-1=8% by mass: thickness of 30 nm
Ionization potential: 5.9 eV, electron affinity: 2.3 eV
(First Electron Transport Layer)
BAlq: thickness of 5 nm
Ionization potential: 5.9 eV, electron affinity: 2.9 eV
(Second Electron Transport Layer)
Alq: thickness of 40 nm
Ionization potential: 5.8 eV, electron affinity: 3.0 eV Structures of NPD, BPM-1, BAlq and Alq are as same as shown above. Structures of TCTA and MCP are shown below.

TCTA

MCP

Finally, metal aluminum was deposited thereon to a thickness of 100 nm and thereby a cathode was formed.

This one, without bringing into contact with air, was brought into a glove box substituted by an argon gas, sealed with a stainless steel sealing canister and a UV-curable adhesive (trade name: XNR5516HV, manufactured by Nagase-Ciba Corp.), and thereby an example organic electroluminescent element (TC-21) was obtained.

(6) Preparation of an Example Organic Electroluminescent Element (TC-22) according to An example organic electroluminescent element (TC-22) was prepared in a same manner of the organic electroluminescent element (TC-21), except that the configurations of organic compound layers were changed as shown below. Values of the ionization potentials and electron affinities of the respective organic compound layers in the TC-22 are described together in configurations of the respective layers.

(First Hole Transport Layer)
Copper phthalocyanine: thickness of 10 nm
Ionization potential: 5.1 eV, electron affinity: 3.4 eV
(Second Hole Transport Layer)
NPD: thickness of 30 nm
Ionization potential: 5.4 eV, electron affinity: 2.4 eV
(Third Hole Transport Layer)
TCTA: thickness of 5 nm
Ionization potential: 5.7 eV, electron affinity: 2.3 eV
(Luminescent Layer)
Layer of a mixture of MCP=92% by mass and BPM-1=8% by mass: thickness of 30 nm
Ionization potential: 5.9 eV, electron affinity: 2.3 eV
(First Electron Transport Layer)
BCP: thickness of 5 nm
Ionization potential: 6.5 eV, electron affinity: 3.0 eV
(Second Electron Transport Layer)
Alq: thickness of 40 nm
Ionization potential: 5.8 eV, electron affinity: 3.0 eV Structures of NPD, TCTA, MCP and Alq are as same as shown above. A structure of BCP is shown below.

BCP (7) Preparation of an Example Organic Electroluminescent Element (TC-23)

An example organic electroluminescent element (TC-23) was prepared in a same manner of the organic electroluminescent element (TC-21), except that the configurations of organic compound layers were changed as shown below. Values of the ionization potentials and electron affinities of the respective organic compound layers in the TC-23 are described together in configurations of the respective layers.

(First Hole Transport Layer)
Copper phthalocyanine: thickness of 10 nm
Ionization potential: 5.1 eV, electron affinity: 3.4 eV
(Second Hole Transport Layer)
NPD: thickness of 30 nm
Ionization potential: 5.4 eV, electron affinity: 2.4 eV
(Third Hole Transport Layer)
TCTA: thickness of 5 nm
Ionization potential: 5.7 eV, electron affinity: 2.3 eV
(Luminescent Layer)
Layer of a mixture of MCP=92% by mass and BPM-1=8% by mass: thickness of 30 nm
Ionization potential: 5.9 eV, electron affinity: 2.3 eV
(First Electron Transport Layer)
ETM-1: thickness of 5 nm
Ionization potential: 6.5 eV, electron affinity: 2.6 eV
(Second Electron Transport Layer)
Alq: thickness of 40 nm
Ionization potential: 5.8 eV, electron affinity: 3.0 eV Structures of NPD, TCTA, MCP, BPM-1, ETM-1 and Alq are as same as shown above.

(8) Preparation of an Example Organic Electroluminescent Element (TC-24)

An organic electroluminescent element (TC-24) was prepared in a same manner of the organic electroluminescent element (TC-21), except that the configurations of organic compound layers were changed as shown below. Values of the ionization potentials and electron affinities of the respective organic compound layers in the TC-24 are described together in configurations of the respective layers.
(First Hole Transport Layer)
Copper phthalocyanine: thickness of 10 nm
Ionization potential: 5.1 eV, electron affinity: 3.4 eV
(Second Hole Transport Layer)
NPD: thickness of 30 nm
Ionization potential: 5.4 eV, electron affinity: 2.4 eV
(Third Hole Transport Layer)
MCP: thickness of 5 nm
Ionization potential: 5.9 eV, electron affinity: 2.3 eV
(Luminescent Layer)
Layer of a mixture of Host-2=92% by mass and BPM-1=8% by mass: thickness of 30 nm
Ionization potential: 6.6 eV, electron affinity: 2.5 eV
(First Electron Transport Layer)
ETM-1: thickness of 5 nm
Ionization potential: 6.5 eV, electron affinity: 2.6 eV
(Second Electron Transport Layer)
BAlq: thickness of 40 nm
Ionization potential: 5.9 eV, electron affinity: 2.9 eV
Structures of NPD, MCP, Host-1, BPM-1, ETM-1 and BAlq are as same as shown above.

2. Evaluation of Material Physicality
(1) Ionization Potential

Each of compounds used in the organic compound layers was deposited on a glass substrate to a thickness of 50 nm. The ionization potential of the layer was measured with an ultraviolet photoelectron analyzer AC-1 (trade name, manufactured by Riken Keiki Co., Ltd.) under the condition of room temperature and atmospheric pressure. Regarding the ETM-1 and Host-2, the ionization potentials thereof were measured according to a UPS method by using a layer of ETM-1 or Host-2 deposited on a metal substrate to a thickness of 50 nm.

(2) Electron Affinity

An ultraviolet to visible absorption spectrum was measured of each of the layers that were used in the measurement of the ionization potential with a spectrophotometer UV3100 (trade name, manufactured by Shimadzu Corporation) and the excitation energy was obtained from energy of a long wavelength edge of the absorption spectrum. The electron affinity was calculated from the excitation energy and the ionization potential.

(3) $T_1$ Energy

A phosphorescent spectrum of each of the films that were used to measure the ionization potential was measured with F4500 manufactured by Hitachi Ltd., at a temperature of 77K, and the $T_1$ energy was obtained from energy at the short wavelength edge of the phosphorescent spectrum.

The ionization potentials, electron affinities and $T_1$ energies of the compounds that were used in examples and comparative examples are shown in Table 1.

TABLE 1

| Name of compound | Ionization potential (eV) | Electron affinity (eV) | $T_1$ energy (kJ/mol) |
| --- | --- | --- | --- |
| CuPc | 5.1 | 3.4 | 230 or less |
| NPD | 5.4 | 2.4 | 230 or less |
| TCTA | 5.7 | 2.3 | 268 |
| BAlq | 5.9 | 2.9 | 226 |

TABLE 1-continued

| Name of compound | Ionization potential (eV) | Electron affinity (eV) | $T_1$ energy (kJ/mol) |
| --- | --- | --- | --- |
| Alq | 5.8 | 3.0 | 230 or less |
| HTM-1 | 5.8 | 2.2 | 276 |
| Host-1 | 6.0 | 2.4 | 272 |
| ETM-1 | 6.5 | 2.6 | 276 |
| Host-2 | 6.6 | 2.5 | 272 |
| BPM-1 | 5.9 | 3.2 | 268 |
| MCP | 5.9 | 2.3 | 278 |
| BCP | 6.5 | 3.0 | 250 |

3. Evaluation of Organic Electroluminescent Element

The above-obtained organic electroluminescent elements (TC-11, 13 through 15, TC-21 through 24) were evaluated according to methods below.

(1) Evaluation of Luminous Efficiency

When a voltage of 11V was applied to organic electroluminescent elements (TC-11, 13 through 15, TC-21 through 24), all showed blue luminescence due to a phosphorescent material (BPM-1).

Further, each of the organic electroluminescent elements (TC-11, 13 through 15, TC-21 through 24) was set on an emission spectrum measurement system ELS1500 (trade name, manufactured by Shimadzu Corporation) and the luminous efficiency (external quantum efficiency) thereof was measured at brightness of 100 Cd/mm². Results are shown in Tables 2 and 3.

(2) Evaluation of Driving Durability

Each of the obtained organic electroluminescent elements (TC-11, 13 through 15, TC-21 through 24) was set on an OLED test system ST-D (trade name, manufactured by Tokyo System Development Co., Ltd.) and was AC pulse driven under conditions of a forward constant current of 0.2 mA, a reverse constant voltage of 10 V, a duty of 50%, a rest time of zero, and a frequency of 250 Hz to obtain a time where brightness decreases to 50% (a time when the brightness decreases to 50% an initial value) $t_{0.5}$. Results are shown in Tables 2 and 3.

TABLE 2

| Element Number | External quantum efficiency of luminescence (%) | $t_{0.5}$ (time) | Note |
| --- | --- | --- | --- |
| TC-11 | 2.1 | 19 | Example |
| TC-13 | 2.9 | 37 | Example |
| TC-14 | 3.3 | 62 | Example |
| TC-15 | 3.5 | 71 | Example |

As shown in Table 2, it is found that organic electroluminescent elements according to examples (TC-11, and TC-13 through 15) are high in luminous efficiency and driving durability.

It is found that in particular, TC-14 and TC-15 that are the third and fourth aspects of the invention and where there are a hole transport layer and an electron transport layer each of which is adjacent to a luminescent layer, the relationships Ip1>Ip2>Ip3 and Ea1<Ea2<Ea3 a satisfied, and the $T_1$ energies of the hole transport layer and the electron transport layer that are adjacent to the luminescent layer are 272 kJ/mol (65 kcal/mol) or more are largely improved in the luminous efficiency and the driving durability.

TABLE 3

| Element Number | External quantum efficiency of luminescence (%) | $t_{0.5}$ (time) | Note |
|---|---|---|---|
| TC-21 | 2.0 | 38 | Example |
| TC-22 | 2.5 | 29 | Example |
| TC-23 | 3.6 | 88 | Example |
| TC-24 | 3.8 | 105 | Example |

As shown in Table 3, it is found that among the organic electroluminescent elements (TC-21 through 24) according to examples, TC-23 and 24 in which the $T_1$ energy of a layer adjacent toward a cathode of the luminescent layer is 272 kJ/mol (65 kcal/mol) or more are high in luminous efficiency and driving durability.

As described above, the organic electroluminescent elements according to the invention are found to be elements of which luminous efficiency and driving durability are largely improved.

According to the invention, a blue phosphorescent organic electroluminescent element in which high luminous efficiency and high driving durability are combined can be provided.

What is claimed is:

1. An organic electroluminescent element comprising:
a pair of electrodes, and
a plurality of organic compound layers being disposed between the pair of electrodes and which include a luminescent layer containing a blue phosphorescent luminescent material and only one kind of host material having the lowest excited triplet energy ($T_1$) of 272 kJ/mol (65 kcal/mol) or more, hole transport layers, and electron transport layers,
wherein one of the hole transport layers is a layer adjacent to the luminescent layer, and when the ionization potentials of the luminescent layer, the hole transport layer adjacent to the luminescent layer, and another of the hole transport layers, respectively, are designated to Ip1, Ip2 and Ip3, the relationship Ip1>Ip2>Ip3 is satisfied,
wherein Ip2 is in the range of 6.0 to 5.5 eV,
wherein one of the electron transport layers is a layer adjacent to the luminescent layer, and when the electron affinities of the luminescent layer, the electron transport layer adjacent to the luminescent layer, and another of the electron transport layers, respectively, are designated to Ea1, Ea2 and Ea3, the relationship Ea1<Ea2<Ea3 is satisfied, and the lowest excited triplet energy $T_1$) of the electron transport layer adjacent to the luminescent layer is 272kJ/mol (65kcal/mol) or more, and
wherein the Ea1 is 2.1 eV or more, the Ea2 is in the range of 2.2 to 3.1 eV, and the Ea3 is 2.6 eV or more.

2. The organic electroluminescent element of claim 1, wherein the lowest excited triplet energy ($T_1$) of the hole transport layer adjacent to the luminescent layer is 272 kJ/mol (65 kcal/mol) or more.

3. The organic electroluminescent element of claim 1, wherein the Ip1 is 6.4 eV or less and the Ip3 is 5.8 eV or less.

4. An organic electroluminescent element comprising:
a pair of electrodes, and
a plurality of organic compound layers being disposed between the electrodes and which include a luminescent layer containing a blue phosphorescent luminescent material and only one kind of host material having the lowest excited triplet energy ($T_1$) of 272 kJ/mol (65 kcal/mol) or more, and electron transport layers,
wherein one of the electron transport layer is a layer adjacent to the luminescent layer, and when the electron affinities of the luminescent layer, the electron transport layer adjacent to the luminescent layer, and another of the electron transport layers, respectively, are designated to Ea1, Ea2 and Ea3, the relationship Ea1<Ea2<Ea3 is satisfied, and the lowest excited triplet energy ($T_1$) of the electron transport layer adjacent to the luminescent layer is 272 kJ/mol (65 kcal/mol) or more, and
wherein the Ea1 is 2.1 eV or more, the Ea2 is in the range of 2.2 to 3.1 eV and the Ea3 is 2.6 eV or more.

5. The organic electroluminescent element of claim 1, wherein the Ip1 is 6.4 eV or less, the Ip2 is in the range of 6.2 to 5.3 eV, and the Ip3 is 5.8 eV or less.

6. The organic electroluminescent element of claim 1, wherein
the plurality of organic compound layers include the luminescent layer comprising first and second luminescent layers each containing a blue phosphorescent luminescent material and only one kind of host material having the lowest excited triplet energy ($T_1$) of 272 kJ/mol (65 kcal/mol) or more, hole transport layers, and electron transport layers,
one of the hole transport layers is a layer adjacent to the first luminescent layer, one of the electron transport is a layer adjacent to the second luminescent layer, the first and second luminescent layers each contain a host material different from each other, and
when the ionization potentials of the first luminescent layer, the hole transport layer adjacent to the first luminescent layer, and another of the hole transport layers, respectively, are designated to Ip1, Ip2 and Ip3, and when the electron affinities of the second luminescent layer, the electron transport layer adjacent to the second luminescent layer, and another of the electron transport layers, respectively, are designated to Ea1, Ea2 and Ea3, the relationships Ip1>Ip2>Ip3 and Ea1<Ea2<Ea3 are satisfied.

7. The organic electroluminescent element of claim 6, wherein both the lowest excited triplet energies ($T_1$) of the electron transport layer adjacent to the second luminescent layer and the hole transport layer adjacent to the first luminescent layer are 272 kJ/mol (65 kcal/mol) or more.

8. The organic electroluminescent element of claim 6, wherein the Ip1 is 6.4 eV or less, the Ip2 is in the range of 6.2 to 5.3 eV, and the Ip3 is 5.8 eV or less.

9. The organic electroluminescent element of claim 6, wherein the Ea1 is 2.1 eV or more, the Ea2 is in the range of 2.2 to 3.1 eV, and the Ea3 is 2.6 eV or more.

10. The organic electroluminescent element of claim 6, wherein the Ip1 is 6.4 eV or less, the Ip2 is in the range of 6.2 to 5.3 eV, the Ip3 is 5.8 eV or less, the Ea1 is 2.1 eV or more, the Ea2 is in the range of 2.2 to 3.1 eV, and the Ea3 is 2.6 eV or more.

11. The organic electroluminescent element of claim 1, wherein the Ip1 is 6.3 eV or less, the Ip2 is in the range of 6.1 to 5.4 eV and the Ip3 is 5.7 eV or less.

12. The organic electroluminescent element of claim 1, wherein the lowest excited triplet energy ($T_1$) of the only one kind of host material is 276 kJ/mol (66 kcal/mol) or more.

13. The organic electroluminescent element of claim 1, wherein the lowest excited triplet energy ($T_1$) of the hole transporting layer adjacent to the luminescent layer is 276 kJ/mol (66 kcal/mol) or more.

14. The organic electroluminescent element of claim 1, wherein the lowest excited triplet energy ($T_1$) of the electron transporting layer adjacent to the luminescent layer is 276 kJ/mol (66 kcal/mol) or more.

15. The organic electroluminescent element of claim 4, wherein the lowest excited triplet energy ($T_1$) of the only one kind of host material is 276 kJ/mol (66 kcal/mol) or more.

16. The organic electroluminescent element of claim 4, wherein the lowest excited triplet energy ($T_1$) of the electron transporting layer adjacent to the luminescent layer is 276 kJ/mol (66 kcal/mol) or more.

* * * * *